United States Patent
Newton

(10) Patent No.: US 8,677,586 B2
(45) Date of Patent: Mar. 25, 2014

(54) INSTALLATION FIXTURE FOR ELASTOMER BANDS AND METHODS OF USING THE SAME

(75) Inventor: Neal Newton, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/439,491

(22) Filed: Apr. 4, 2012

(65) Prior Publication Data

US 2013/0263427 A1 Oct. 10, 2013

(51) Int. Cl.
*B23P 19/08* (2006.01)

(52) U.S. Cl.
USPC ........................................ 29/235; 29/243.518

(58) Field of Classification Search
USPC ............. 29/235, 223, 222, 243.517, 243.518; 269/189
See application file for complete search history.

(56) References Cited

U.S. PATENT DOCUMENTS

| | | | |
|---|---|---|---|
| 5,636,098 A * | 6/1997 | Salfelder et al. | 361/234 |
| 5,740,009 A | 4/1998 | Pu et al. | |
| 6,090,304 A | 7/2000 | Zhu et al. | |
| 6,364,957 B1 | 4/2002 | Schneider et al. | |
| 6,771,482 B2 | 8/2004 | Kenney | |
| 6,944,006 B2 * | 9/2005 | Zheng et al. | 361/234 |
| 7,252,738 B2 | 8/2007 | Tong et al. | |
| 7,274,004 B2 | 9/2007 | Benjamin et al. | |
| 7,431,788 B2 | 10/2008 | Ricci et al. | |
| 7,514,506 B2 | 4/2009 | Mansfield et al. | |
| 7,723,994 B2 | 5/2010 | Kimball et al. | |
| 7,884,925 B2 | 2/2011 | Howard et al. | |
| 7,942,425 B2 | 5/2011 | Shojima | |
| 8,038,796 B2 | 10/2011 | Ricci et al. | |
| 8,409,995 B2 | 4/2013 | Kobayashi | |
| 2009/0179366 A1 | 7/2009 | Herchen et al. | |
| 2009/0200269 A1 | 8/2009 | Kadkhodayan et al. | |
| 2010/0044974 A1 * | 2/2010 | Kenworthy et al. | 279/128 |
| 2010/0078899 A1 | 4/2010 | Povolny et al. | |
| 2010/0108261 A1 | 5/2010 | Augustino et al. | |
| 2010/0117309 A1 | 5/2010 | Yudovsky | |
| 2012/0159740 A1 * | 6/2012 | Strelow et al. | 16/2.2 |

OTHER PUBLICATIONS

International Search Report and Written Opinion mailed Jun. 14, 2013 for PCT/US2013/033436.

* cited by examiner

*Primary Examiner* — Lee D Wilson
*Assistant Examiner* — Jamal Daniel
(74) *Attorney, Agent, or Firm* — Buchanan Ingersoll & Rooney PC

(57) ABSTRACT

A method of installing an elastomer band as a protective edge seal around a portion of a semiconductor substrate support used for supporting a semiconductor substrate in a plasma processing chamber, which includes expanding an elastomer band into a circular shape having a diameter greater than a diameter of a mounting groove within the substrate support; clamping the elastomer band in the expanded shape between a base ring and a clamp ring; placing the elastomer band over the substrate support in the expanded shape; and releasing the elastomer band from between the base and clamp rings, which contracts the elastomer band into the mounting groove of the substrate support.

14 Claims, 12 Drawing Sheets

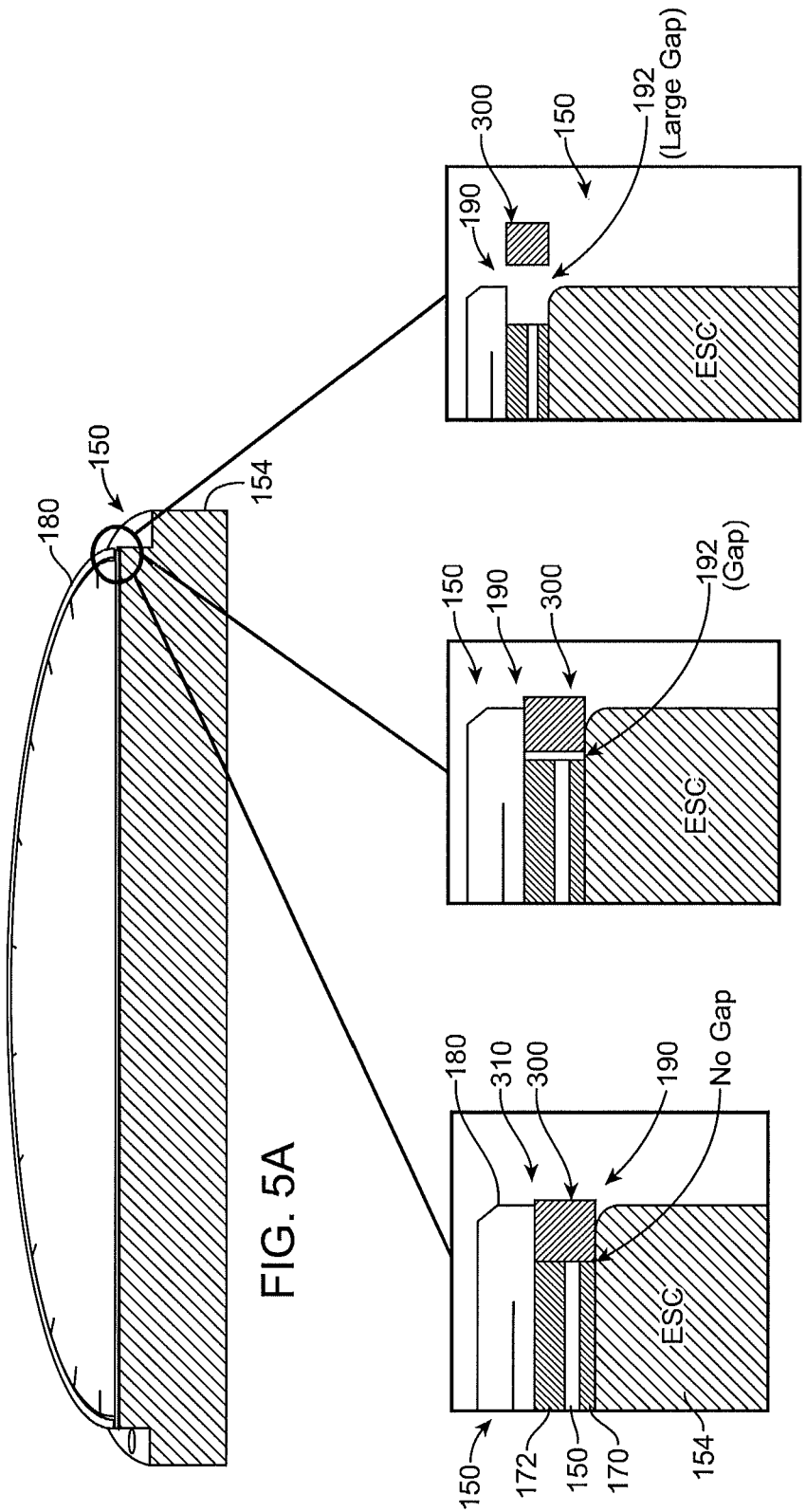

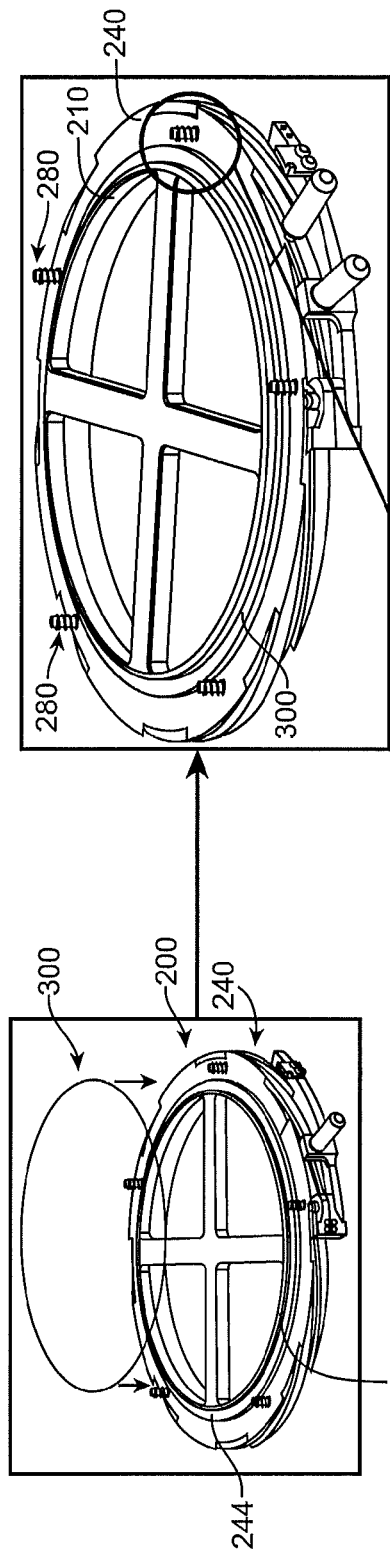
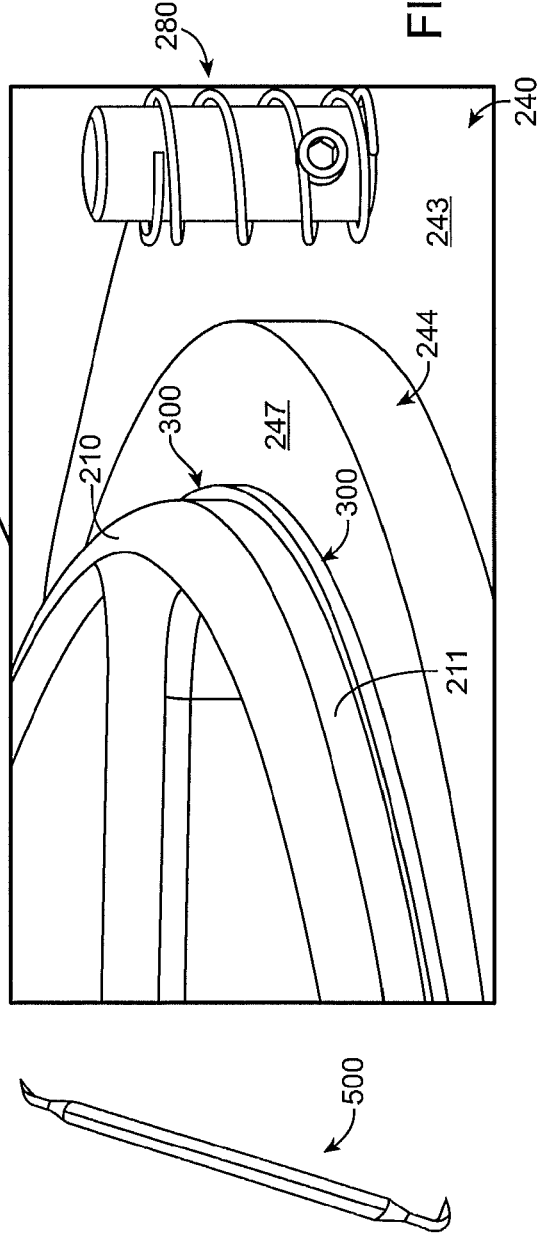

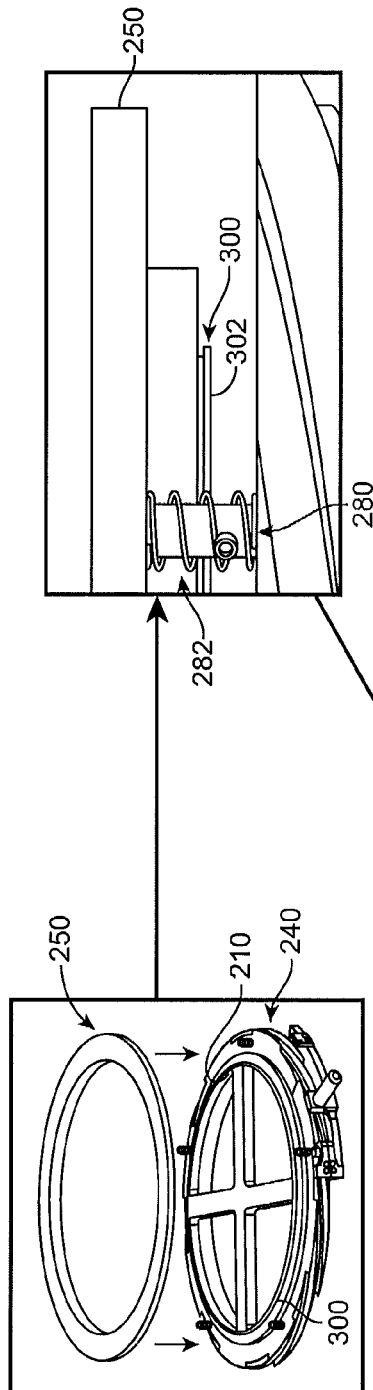
FIG. 7A
FIG. 7B
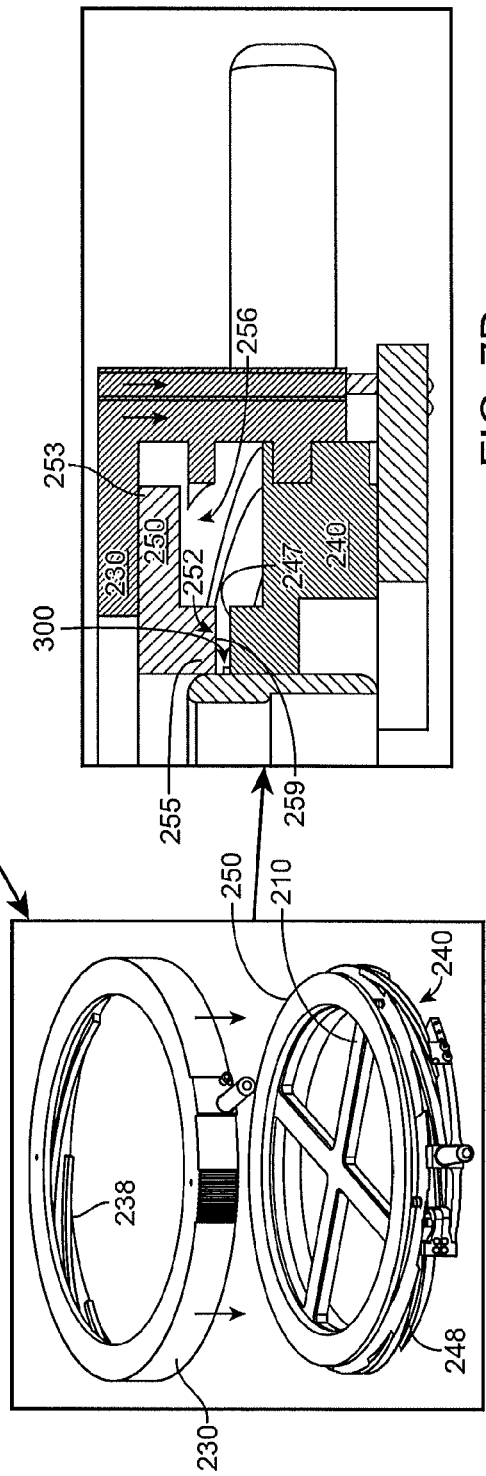
FIG. 7C
FIG. 7D

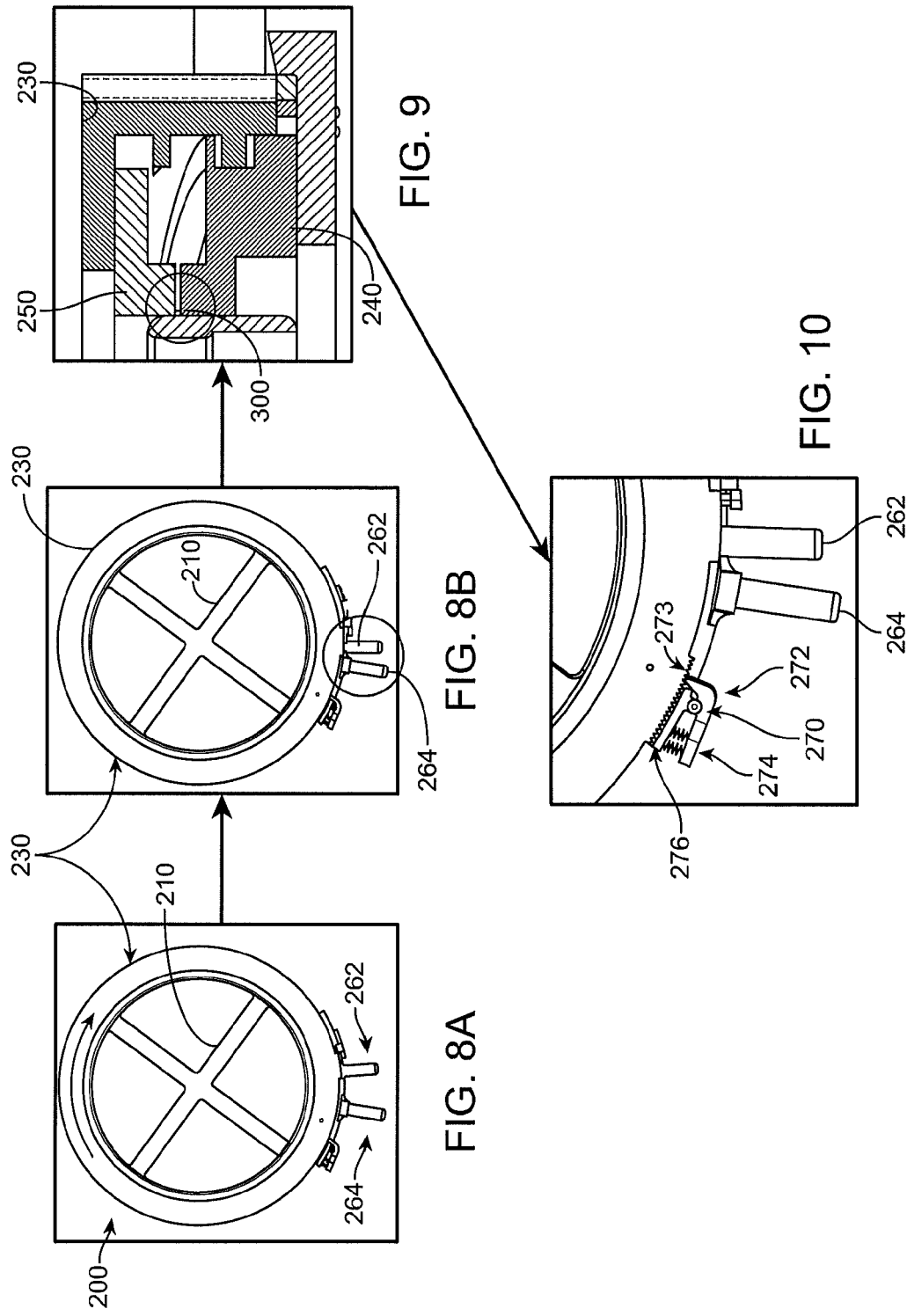

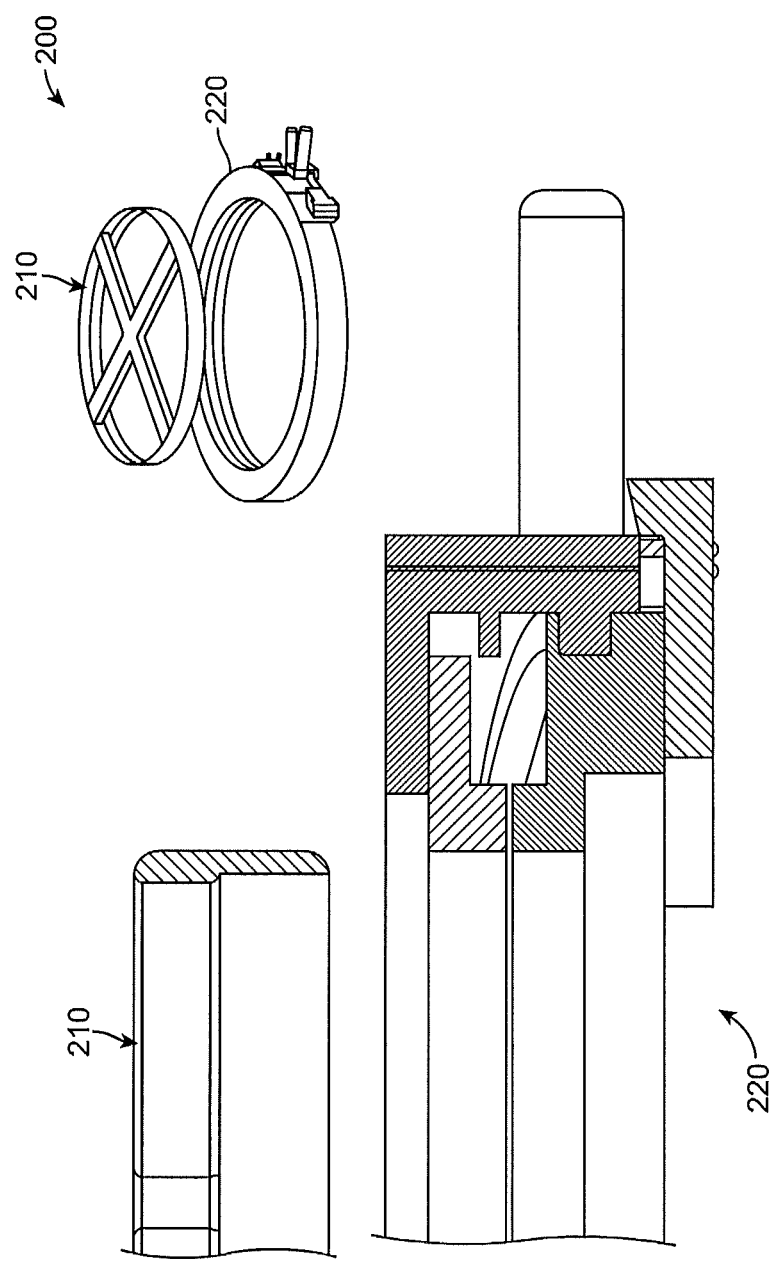

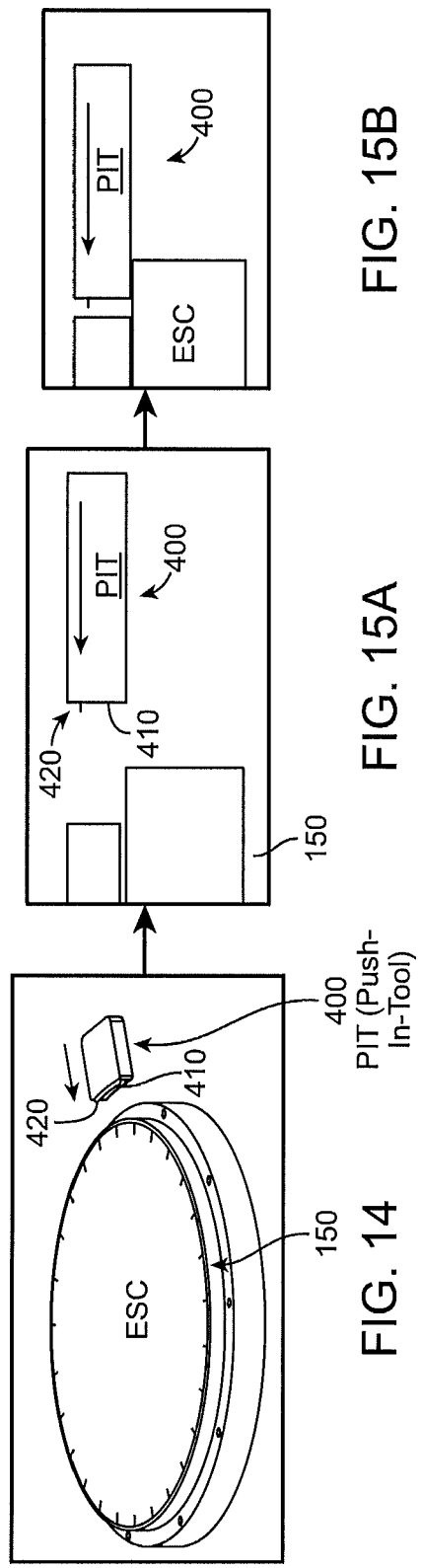

INSTALLATION FIXTURE FOR ELASTOMER BANDS AND METHODS OF USING THE SAME

FIELD OF THE INVENTION

The present disclosure relates to an installation fixture for installing an elastomer band around a substrate support and methods of using the installation fixture.

BACKGROUND

Integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these circuits have led them to become a ubiquitous feature of modem digital electronics.

The fabrication of integrated semiconductor circuits typically takes place in a reactive ion etching system, such as a parallel plate reactor or inductively coupled plasma reactor. A reactive ion etching system may consist of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, $He$ or $Ar$ is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls.

Plasmas used for reactive ion etching are highly corrosive species and chamber component surfaces that are exposed to plasmas can degrade quickly. Such degradation of chamber components is costly and can lead to contamination of chamber components or to contamination of a substrate being processed in the chamber. Such degradation requires replacement of contaminated chamber components and/or cleaning of the contaminated chamber components. Such replacement and/or cleaning of the chamber components leads to downtime of the processing chamber.

A substrate support comprising an electrostatic chuck (ESC) for electrostatically clamping a substrate to the support is one such chamber component that may undergo degradation due to exposure to a plasma environment. These types of substrate supports typically comprise a number of components adhered to one another. For example, the support may comprise a cooling plate, a heater element and/or a ceramic plate bonded to one another by a suitable adhesive. To minimize degradation from exposure to the plasma environment, it is common to place an elastomer band around these components in order to protect the adhesive from direct exposure to the plasma environment, such as described in commonly-owned U.S. Pat. No. 7,431,788. However, the elastomer band is then directly exposed to the plasma environment and suffers degradation therefrom. The elastomer band also suffers degradation from compression forces under operational conditions.

The manner in which an elastomer band is installed around a substrate support may also yield localized stresses in the elastomer band, which leads to the elastomer band being further susceptible to degradation from exposure to the plasma environment. Typically, an elastomer band is installed around a substrate support by hand in a 5-point star-shaped pattern. Such an installation pattern creates highly localized stress areas in the elastomer, which are weaker areas in the elastomer and subjects these areas to greater mass loss when exposed to a plasma environment, usually leading to cracking of the elastomer.

Thus, there is a need for an improved method of installing an elastomer band around a substrate support such that the elastomer band demonstrates increased resistance to degradation from exposure to a plasma environment.

SUMMARY

Disclosed herein is an elastomer band installation fixture that installs an elastomer band around a substrate support with increased resistance to degradation from exposure to a plasma environment and compression forces. An elastomer band installed around a substrate support with the installation fixture disclosed herein thus has a longer operational lifetime, thereby decreasing the frequency in which the elastomer band needs to be replaced. Also disclosed herein are methods of using the elastomer band installation fixture to install an elastomer band around a substrate support.

In accordance with an exemplary embodiment, a method of installing an elastomer band as a protective edge seal around a portion of a semiconductor substrate support used for supporting a semiconductor substrate in a plasma processing chamber, comprises: expanding an elastomer band into a circular shape having a diameter greater than a diameter of a mounting groove within the substrate support; clamping the elastomer band in the expanded shape between a base ring and a clamp ring; placing the elastomer band over the substrate support in the expanded shape; and releasing the elastomer band from between the base and the clamp rings, which contracts the elastomer band into the mounting groove of the substrate support.

In accordance with another exemplary embodiment, an annular installation fixture adapted to mount an elastomer band in a mounting groove around a semiconductor substrate support used for supporting a semiconductor substrate in a plasma processing chamber comprises: an installation unit comprising: a top ring, the top ring having one or more internal threads; a clamp ring; a base ring, the base ring having one or more external threads, which are configured to receive the one or more internal threads of the top ring, and upon tightening of the top ring onto the base ring, the elastomer band is clamped between the clamp ring and the base ring; and a latch and release mechanism, which releases the elastomer band into the mounting groove by un-clamping the elastomer band from between the clamp ring and the base ring; and a loading member, which positions the elastomer band within the installation unit between the clamp ring and the base ring.

In accordance with a further exemplary embodiment, an elastomer band installation kit comprises: an annular installation fixture adapted to mount an elastomer band in a mounting groove around a semiconductor substrate support comprising: an installation unit comprising: a top ring, the top ring having one or more internal threads; a clamp ring; a base ring, the base ring having one or more external threads, which are configured to receive the one or more internal threads of the top ring, and upon tightening of the top ring onto the base ring, the elastomer band is clamped between the clamp ring and the base ring; and a latch and release mechanism, which releases the elastomer band into the mounting groove by un-clamping the elastomer band from between the clamp ring and the base ring; and a loading member, which positions the elastomer band within the installation unit between the clamp ring and the base ring; and a curved embedding tool adapted to press the elastomer band into the mounting groove in the substrate support, the tool comprising a curved surface that is curved in a concave manner, and has a radially extending portion, which pushes the elastomer band into the mounting groove.

It is to be understood that both the foregoing general description and the following detailed description are exemplary and explanatory and are intended to provide further explanation of the invention as claimed.

BRIEF DESCRIPTION OF THE DRAWINGS

Reference will now be made in detail to the present preferred embodiments of the invention, examples of which are illustrated in the accompanying drawings. Wherever possible, the same reference numbers are used in the drawings and the description to refer to the same or like parts.

FIGS. 5A-5D are a series of cross-sectional views of an substrate support having an elastomer band in a series of installation states.

FIGS. 6A-6C are a series of perspective views of the loading of the elastomer band onto the installation fixture in accordance with an exemplary embodiment.

FIGS. 7A-7D are a series of perspective views of the placement of the clamp ring onto an upper surface of the elastomer band.

FIGS. 8A and 8B are top views of the loading of the elastomer band into the installation fixture.

FIG. 9 is a cross-sectional view of the top ring fully threaded into the base ring in accordance with an exemplary embodiment.

FIG. 10 is a top view of the top ring engaged with a dual latching mechanism, which holds the top ring and the elastomer band in place.

FIG. 11 is a cross-sectional view of the elastomer band loaded within the installation unit and the step of removing the loading member from the installation unit.

FIG. 14 is a perspective view of the substrate support having an elastomer band within the mounting groove and an embedding tool.

FIGS. 15A and 15B are cross-sectional views of the substrate support and the embedding tool in use.

DETAILED DESCRIPTION

Substrate supports for reactive ion etch processing chambers typically include a lower electrode assembly comprising an electrostatic clamping layer on which a substrate or wafer is clamped during processing in a plasma processing chamber. The lower electrode assembly can also include various layers bonded to a temperature controlled base plate. For example, the assembly can include an upper ceramic layer incorporating one or more electrostatic electrodes adhesively bonded to an upper side of a heater plate, one or more heaters adhesively bonded to a bottom of the heater plate, and a temperature controlled base plate (hereafter referred to as cooling plate) adhesively bonded to the heaters and heater plate. To protect the plasma-exposed adhesive bond layers, an edge seal comprising an elastomer band may be disposed around the bond layers of the substrate support.

Figure 1:
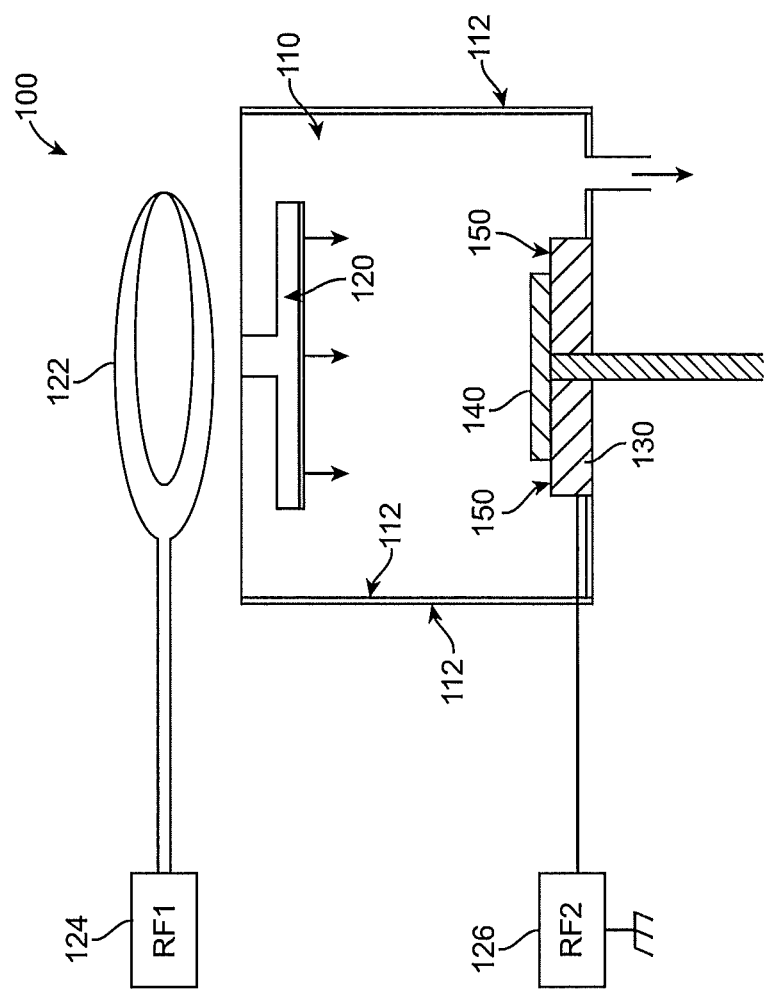
FIG. 1 is a cross-sectional view of a processing chamber suitable for plasma etching semiconductor substrates.

FIG. 1 shows a cross-sectional view of an exemplary plasma reactor 100 for etching substrates. As shown in FIG. 1, the plasma reactor 100 includes a plasma processing chamber 110, an antenna disposed above the chamber 110 to generate plasma, which is implemented by a planar coil or RF coil 122. The planar or RF coil 122 is typically energized by an RF generator 124 via a matching network (not shown). Such chambers 110 are called inductively coupled plasma (ICP) chambers. To supply process gas to the interior of the chamber 110, there is provided a gas distribution plate or showerhead 120, which preferably includes a plurality of holes for releasing gaseous source materials, e.g., the etchant source gases, into the RF-induced plasma region between the showerhead 120 and a semiconductor substrate or wafer 140 supported on a substrate support 150 comprising lower electrode assembly 130. While an inductively coupled plasma reactor is shown in FIG. 1, the plasma reactor 100 can incorporate other plasma generating sources such as capacitive coupled plasma (CCP), microwave, magnetron, helicon, or other suitable plasma generating equipment, in which case the antenna is omitted.

The gaseous source materials can be introduced into the chamber 110 by other arrangements such as one or more gas injectors extending through the top wall and/or gas ejection ports built into the walls 112 of the chamber 110. Etchant source chemicals include, for example, halogens such as $Cl_2$ and $BCl_3$ when etching through aluminum or one of its alloys. Other etchant chemicals (e.g., $CH_4$, HBr, HCl, $CHCl_3$) as well as polymer forming species such as hydrocarbons, fluorocarbons, and hydro-fluorocarbons for side-wall passivation of etched features may also be used. These gases can be employed along with optional inert and/or nonreactive gases.

In use, a wafer 140 is introduced into chamber 110 defined by chamber walls 112 and disposed on the lower electrode assembly 130. The wafer 140 is preferably biased by a radio frequency generator 126 (also typically via a matching network). The wafer 140 can comprise a plurality of integrated circuits (Ids) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the source gas) etch exposed surfaces of the wafer 140. The by-products, which can be volatile, are then exhausted through an exit port. After processing is complete, the wafer 140 can be subjected to further processing and eventually diced to separate the ICs into individual chips.

The reactor 100 can also be used for metal, dielectric and other etch processes. In plasma etch processing, the gas distribution plate can be a circular plate situated directly below a dielectric window in an ICP reactor or form part of an upper electrode assembly in a CCP reactor called a parallel plate reactor wherein the gas distribution plate is a showerhead electrode oriented parallel to a semiconductor substrate or wafer 140. The gas distribution plate/showerhead electrode 120 contains an array of holes of a specified diameter and spatial distribution to optimize etch uniformity of the layers to be etched, e.g., a photoresist layer, a silicon dioxide layer and an underlayer material on the wafer.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Figure 2:
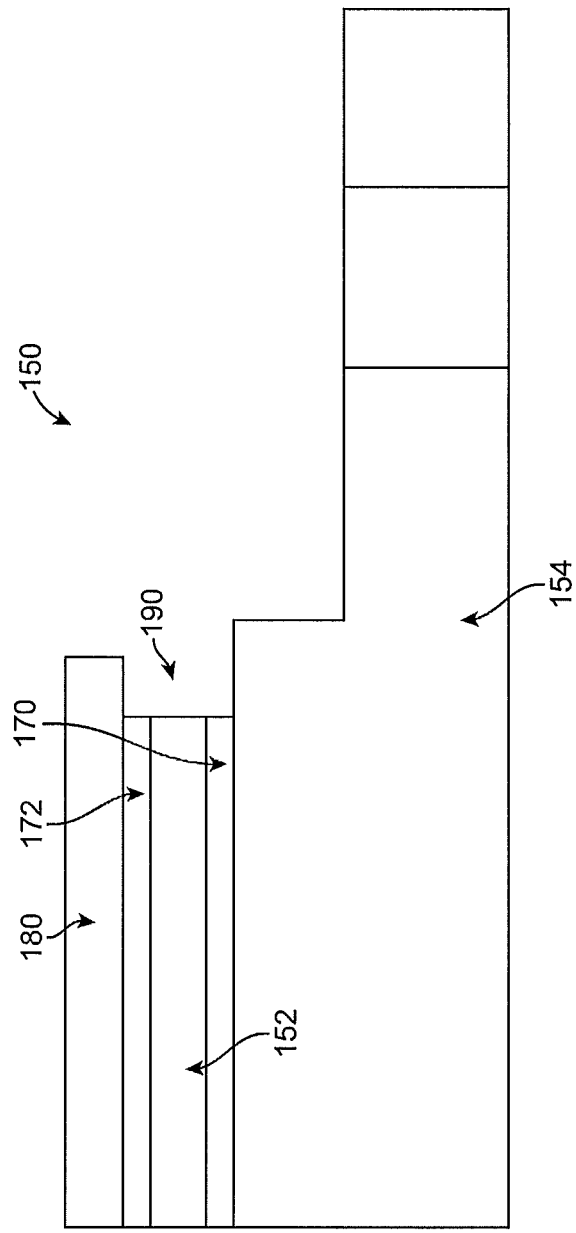
FIG. 2 is a cross-sectional view of a portion of substrate support having various layers bonded together with exposed bond layers located in a mounting groove adapted to receive an edge seal comprising an elastomeric band.

FIG. 2 shows a cross-sectional view of a portion of substrate support 150 having various layers bonded together with exposed bond layers located in a mounting groove 190 adapted to receive an edge seal comprising an elastomeric band 300. The substrate support 150 comprises a heater plate 152 comprised of a metal or ceramic. An adhesive bonding layer 170 is disposed below the heater plate 152 and bonds the heater plate 152 to a cooling plate 154. Another adhesive bonding layer 172 is disposed above the heater plate 152 and bonds the heater plate 152 to a ceramic plate 180 incorporating one or more electrostatic clamping electrodes. The ceramic plate 180 and the cooling plate 154 may have portions that extend beyond the outermost portions of heater plate 152 and bonding layers 170, 172 to form a mounting groove 190. The outermost portions of the heater plate 140 and the bond layers 170, 172 are substantially aligned with respect to one another. Preferably, the ceramic plate 180 has a larger diameter than the heater plate 152 and the bonding layers 170, 172.

In one embodiment, the cooling plate 154 can be configured to provide temperature control by the inclusion of fluid channels (not shown) therein through which a temperature controlled liquid can be circulated. The cooling plate 154 is typically a metal base plate, which functions as the lower RF electrode in the plasma chamber. The cooling plate 154 preferably comprises an anodized aluminum or aluminum alloy. Any suitable material, including metallic, ceramic, electrically conductive and dielectric materials can be used. In one embodiment, the cooling plate 154 is formed from an anodized machined aluminum block. Alternatively, the cooling plate 154 could be of ceramic material with one or more electrodes located therein and/or on an upper surface thereof. In addition, the cooling plate 154 preferably has a uniform thickness from the center to the outer edge or diameter thereof and is preferably a thin circular plate. The cooling plate 154 may comprise a series of though-holes for receiving mechanical fasteners, which fasten substrate support 150 to the processing chamber.

The heater plate 152 can be in the form of a metal or ceramic plate with at least one film heater coupled to a bottom of the metal or ceramic plate. The at least one film heater can be a foil laminate (not shown) comprising a first insulation layer (e.g., dielectric layer), a resistive heating layer (e.g., one or more strips of electrically resistive material) and a second insulation layer (e.g., dielectric layer). The insulation layers preferably consist of materials having the ability to maintain its physical, electrical and mechanical properties over a wide temperature range including resistance to corrosive gases in a plasma environment such as Kapton or other suitable polyimide films. The resistive heating layer preferably consists of a high strength alloy such as Inconel or other suitable alloy or anti-corrosion and resistive heating materials. Typically, the film heater is in the form of a laminate of Kapton, Inconel and Kapton having a total thickness of about 0.005 to about 0.009 of an inch and more preferably about 0.007 of an inch thick.

The ceramic layer 180 is preferably an electrostatic clamping layer of ceramic material with an embedded electrode comprised of a metallic material, such as W, Mo etc. In addition, the ceramic layer 180 preferably has a uniform thickness from the center to the outer edge or diameter thereof and is preferably a thin circular plate suitable for supporting 200 mm, 300 mm or 450 mm diameter wafers. Details of a lower electrode assembly having an upper electrostatic clamping layer, the heater layer and the bonding layers 170, 172 are disclosed in commonly owned U.S. Pat. No. 8,038,796, wherein the upper electrostatic clamping layer has a thickness of about 0.04 inch, the upper bonding layer has a thickness of about 0.004 inch, the heater plate 152 comprises a metal or ceramic plate of about 0.04 inch thickness and a heater film of about 0.01 inch thickness, and the lower bonding layer 170 has a thickness of about 0.013 to 0.04 inch. However, different thicknesses of the clamping layer, bond layers 170, 172 and heater layer 152 can be selected to achieve desired process results.

The adhesive bonding layers 170, 172 are preferably formed from a low modulus material such as an elastomeric silicone or silicone rubber material. However, any suitable bonding material can be used. The thickness of adhesive layers 170, 172 can vary depending on the desired heat transfer coefficient. Thus, the thickness of the adhesive layers 170, 172 can be uniform or non-uniform to provide a desired heat transfer coefficient based on manufacturing tolerances of adhesive bonding layers 170, 172. Typically, the thickness of adhesive bonding layers 170, 172 will vary over its applied area by plus or minus a specified variable. Preferably, if the bond layer thickness does not vary by more than 1.5 percent, the heat transfer coefficient between components of the substrate support 150 can be made substantially uniform. For example, for a substrate support 150 comprising an electrode assembly used in the semiconductor industry, the adhesive bonding layers 170, 172 preferably have a chemical structure that can withstand a wide range of temperatures. Thus, the low modulus material can comprise any suitable material, or combination of materials, such as a polymeric material compatible with a vacuum environment and resistant to thermal degradation at high temperatures (e.g., up to 500° C.). In one embodiment, the adhesive bonding layers 170, 172 may comprise silicone and be between about 0.001 to about 0.050 of an inch thick and more preferably about 0.003 to about 0.030 of an inch thick.

As shown in FIG. 2, a portion of the cooling plate 154 and ceramic plate 180 can extend beyond an outermost portion of the heater plate 152, adhesive bond layers 170, 172, thereby forming a mounting groove 190 in the substrate support 150. The material(s) of adhesive bonding layers 170, 172 are typically not resistant to the reactive etching chemistry of semi-conductor plasma processing reactors and must, therefore, be protected to accomplish a useful operation lifetime. To protect the adhesive bonding layers 170, 172, an edge seal in the form of an elastomeric band 300 is placed into the mounting groove 190 to form a tight seal that prevents penetration of the corrosive gases of semi-conductor plasma processing reactors. See, for example, commonly owned U.S. Pat. No. 7,884,925 and U.S. Patent Publication No. 2010/0078899.

Figure 3:
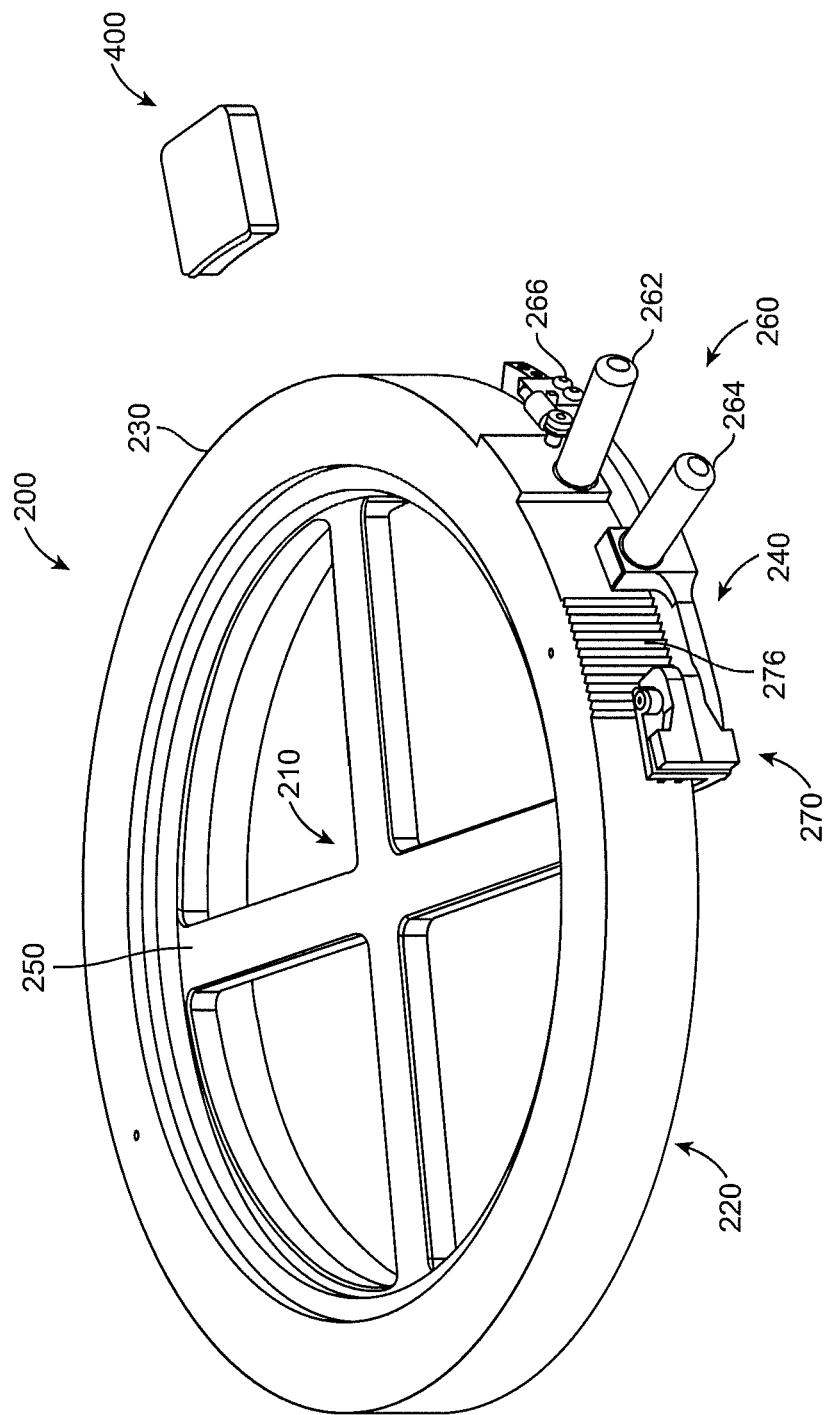
FIG. 3 is a perspective view of an installation fixture, which includes a loading member and installation unit, which includes a top ring, a clamp ring and a base ring in accordance with an exemplary embodiment.

FIG. 3 is a perspective view of an installation fixture 200 in accordance with an exemplary embodiment. As shown in FIG. 3, the installation fixture 200 includes an elastomer band loader 210 and an installation unit 220. The installation unit 220 includes a top ring 230, a base ring 240, and a clamp ring 250, which is positioned between the top and the base rings 230, 240. The installation unit 220 also includes a latch and release mechanism 260, which releases the elastomer band 300 into the mounting groove 190 upon demand. In accordance with an embodiment, the latch and release mechanism 260 includes a first handle or lever 262 attached to an outer edge of the top ring 230, a second handle or lever 264 attached to an outer edge of the base ring 240, an extension spring 266 attached to the top ring 230, and a dual latch mechanism 270. The dual latch mechanism 270 includes a spring-loaded latch 272, which has a lever or prong 274, which engages a series of teeth or indents 276 on an outer portion of the top ring 230

Figure 4:
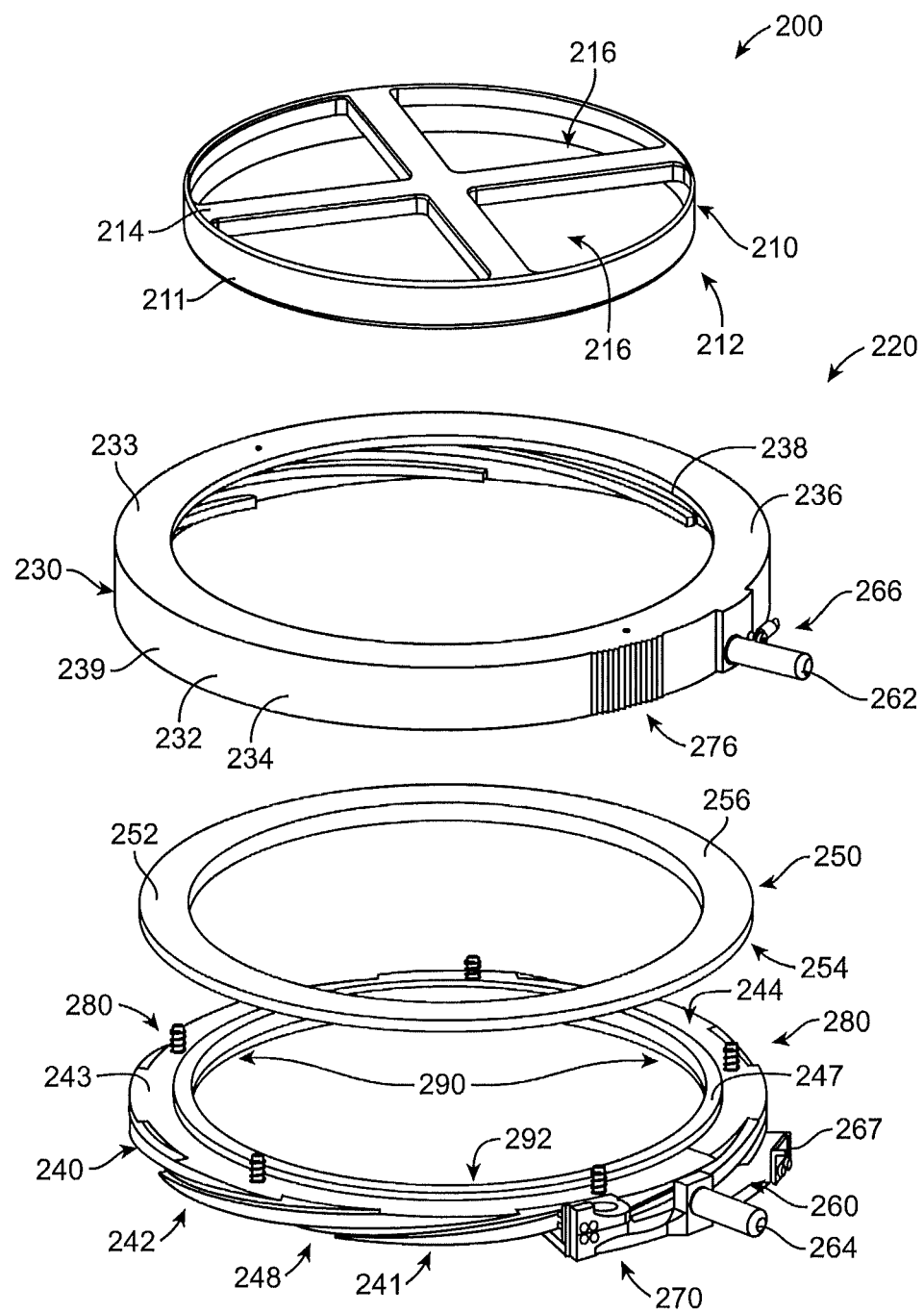
FIG. 4 is another perspective view of the installation fixture of FIG. 3 in an exploded format in an accordance with an embodiment.

FIG. 4 is another perspective view of the installation fixture 200 in an exploded format. As shown in FIG. 4, the elastomer band loader 210 comprises an annular member 212 adapted to position the elastomer band within the installation unit 220. The annular member 212 is configured to receive an elastomer band 300 around an outer edge or circumference 211 thereof. In accordance with an embodiment, one or more cross members 214 extends across the annular member 212. The one or more cross members 214 preferably includes at least one opening or gap 216 therein. Alternatively, the elastomer band loader 210 can include a handle or other means for lifting upward on the elastomer band loader 210. The one or more cross members 214 and/or handles (not shown), provide a means to remove the elastomer band loader 210 from within the installation unit 220 after the elastomer band 300 has been loaded within the installation unit 220.

The top ring 230 includes a stepped ring 232 with a flat upper section 236 and a tubular section 234 extending downwardly from an outer periphery of the upper section 236. The upper section 236 extends from an upper edge 233 of the tubular section 234 and extends inward. The tubular section 234 includes one or more inner or internal threads 238, which are configured to receive one or more outer or external threads 248 on the base ring 240. The top ring 230 also includes a series of ridges or teeth 276 on an outer surface 239 on the tubular section 234, which are configured to engage with a dual latch mechanism 270 on the base ring 240. The top ring 230 also includes a handle 262 and an extension spring 266. The handle 262 is configured to engage the latch and release mechanism 260 on the base ring 240. The extension spring 266 mates with a corresponding member 267 of the base ring 240, and the extension spring 266 causes the top ring 230 to rotate (i.e., unthread from the base ring 240) when the top ring 230 is not locked into place with the base ring 240 as described below.

The base ring 240 is preferably an annular member 242 having one or more external threads 248 on an outer surface 241, which are configured to engage the one or more internal threads 238 of the top ring 230. The base ring 240 also includes an annular flange 244, which is positioned on an upper surface 243 of the annular member 242 on an inner edge 245 thereof. One or more compression springs 280 extend upward from the upper surface 241 of the annular member 242. The one or more compression springs 280 are preferably three (3) to seven (7) in number, and more preferably five (5) in number, and wherein the one or more compression springs 280 are equally positioned around the annular member 242.

The clamp ring 250 is an annular member 252, which clamps the elastomer band 300 between a lower surface 254 of the clamp ring 250 and an upper surface 247 of the annular flange 244 of the base ring 240. The clamp ring 250 is preferably comprised of an annular member 252 having an upper portion 253 and a lower portion 255, wherein an inner circumference or diameter of the upper and the lower portions 253, 255 coincide with one another. In accordance with an embodiment, the lower portion 255 has an outer diameter, which is less than an outer diameter of the upper portion 253, and which forms a step 256 formed by a lower surface of the upper portion 253 to an outer surface of the lower portion 255 (See FIG. 7D). In accordance with an embodiment, the upper and the lower portions 253, 255, each have a relatively flat or planar upper or lower surface 257, 259. In accordance with an embodiment, the clamp ring 250 is made from a low-friction, non-stick plastic material such as polyethylene terephthalate (PET) or a fluorocarbon, e.g., TEFLON (PTFE-PolyTetraFluoroEthylene, manufactured by DuPont).

The base ring 240 preferably has an inner diameter 290 with respect to an innermost surface 292 of between about 11.0 to 12.0 inches with respect a substrate support designed for processing substrates or wafers with a 300 mm diameter. With respect to processing substrates or wafers with a diameter less than 300 mm, such as 200 mm, or greater than 300 mm, such as 450 mm, the diameters of installation fixture 200 are scaled accordingly.

The installation fixture 200 is preferably made from a low-friction plastic material such as polyethylene terephthalate (PET) or a fluorocarbon, e.g., TEFLON® (PTFE-Poly-TetraFluoroEthylene, manufactured by DuPont). In accordance with an embodiment, the clamp ring 250 is made of polytetrafluoroethylene (PTFE), TEFLON, and the base ring 240 is made of polyethylene terephthalate (PET) or other fluorocarbon. In accordance with an embodiment, the clamp ring 250 is made of a material that has a lower adhesion factor (i.e., less sticky) than the base ring 250, such that the elastomer ring 300 does not stick or adhere to the clamp ring 250 during installation of the elastomer band 300 into the mounting groove 190. Alternatively, the installation fixture 200 may be made from other materials, such as quartz, ceramic, metal or silicon. Methods of making installation fixture 200 are not particularly limited. For example, the installation fixture 200 can be machined from a block or annular piece of starting material. Alternatively, the installation fixture 200 can be injection molded.

FIGS. 5A-5D are a series of cross-sectional views of an substrate support 150 having an elastomer band 300 in a series of installation states. As shown in FIG. 5A, the substrate support 150 is comprised of various layers bonded together with exposed bond layers located in a mounting groove 190 adapted to receive an edge seal 310 in the form of an elastomeric band 300. The substrate support 150 comprises a heater plate 152 comprised of a metal or ceramic, an adhesive bonding layer 170 disposed below the heater plate 152, which bonds the heater plate 152 to a cooling plate 154. An adhesive bonding layer 172 is disposed above the heater plate 152 and bonds the heater plate 152 to the ceramic plate 180 incorporating one or more electrostatic clamping electrodes. The ceramic plate 180 and the cooling plate 154 may have portions that extend beyond the outermost portions of heater plate 152 and bonding layers 170, 172 to form a mounting groove 190. The outermost portions of the heater plate 140 and the bond layers 170, 172 are substantially aligned with respect to one another. Preferably, the ceramic plate 180 has a larger diameter than the heater plate 152 and the bonding layers 170, 172.

In FIG. 5B, the elastomer band 300 has been installed in the mounting groove 190 and is fully seated within the groove 190. As shown in FIG. 5B, when the elastomer band 300 is properly seated, the groove 190 is fully occupied with the elastomer band 300.

FIGS. 5C and 5D show the elastomer band 300 in different states of installation within the groove 190. In FIG. 5C, the elastomer band 300 is installed within the groove 190 of the substrate support 150, however, the elastomer band 300 is not fully seated. In FIG. 5D, the elastomer band 300 is not installed within the groove 190, and a gap 192 exists between the outer edge of the heater plate 152 and the adhesive layers 170, 172.

In accordance with an exemplary embodiment, the elastomer band 300 can be constructed from any suitable semiconductor processing compatible material. For example, the elastomer band 300 is preferably constructed of curable fluoroelastomeric fluoropolymers (FKM) capable of being cured to form a fluoroelastomer, a curable perfluoroelastomeric perfluoropolymers (FFKM), and/or a material having high chemical resistance, low and high temperature capability, resistance to plasma erosion in a plasma reactor, low friction, and electrical and thermal insulation properties. The shape of the elastomer band 300 is also not particularly limited and the elastomer bands may be circular, square or rectangular in cross-section. The elastomer bands 300 may also have an irregularly shaped cross-section, such as rectangular cross-section with a concave outer surface as disclosed in commonly owned U.S. application Ser. No. 13/277,873, filed Oct. 20, 2011.

FIGS. 6A-6C are a series of perspective views of the loading of the elastomer band 300 onto the installation fixture 200 in accordance with an exemplary embodiment. As shown in FIG. 6A, the elastomer band loader 210 is positioned within the annular flange 244 of the annular member 242 of the base ring 240. The outer circumference 211 of the elastomer band loader 210 is sized to fit within the base ring 240. In accordance with an embodiment, the elastomer band 300 is placed around the outer circumference 211 of the elastomer band loader 210 by hand.

As shown in FIGS. 6B and 6C, once the elastomer band loader 210 has been positioned within the base ring 240, the elastomer band 300 is placed around the outer surface of the elastomer band loader 210 and on an upper surface 247 of the annular flange 244 of the base ring 240. The elastomer band 300 is preferably placed around an outermost circumference 211 of the elastomer band loader 210, by stretching the elastomer band 300 to fit the circumference. Once the elastomer band 300 has been placed around the outermost circumference 211 of the elastomer band loader 210 and placed on the upper surface 247 of the annular flange 244 of the base ring 240, if necessary, the elastomer band 300 is untwisted with an o-ring pick 500 or other suitable tool to properly seat the elastomer band 300 on the upper surface 247 of the annular flange 244 of the base ring 240 without twists.

FIGS. 7A-7D are a series of perspective views of the placement of the clamp ring 250 onto an upper surface of the elastomer band 300. As shown in FIGS. 7A and 7B, once the elastomer band 300 has been properly seated on the upper surface 247 of the annular flange 244 of the base ring 240, the clamp ring 250 is lowered onto the base ring 240. As the clamp ring 250 is lowered onto an upper surface 302 of the elastomer band 300, the springs 282 on each of the one or more compression rings 280 compress downward. The springs 282 of the one or more compression rings 280 lift or push the clamp ring 250 upward upon release.

As shown in FIG. 7C, the top ring 230 is then lowered onto the base ring 240. As the top ring 230 is lowered onto the base ring 240, the one or more internal threads 238 of the top ring 230 engage the one or more external threads 248 of the base ring 240, which clamps or fixes the clamp ring 250 onto an upper surface 302 of the elastomer band 300. The elastomer band 300 is then compressed between a lower surface 252 of the clamp ring 250 and an upper surface 247 of the annular flange 244 of the base ring 240.

FIGS. 8A and 8B are top views of the loading of the elastomer band 300 into the installation fixture 200. As shown in FIGS. 8A and 8B, once the top ring 230 is placed on the clamp ring 250 and the base ring 240, the top ring 230 is rotated in a clockwise direction onto the base ring 240 using the handles 262, 264, which compresses the elastomer band 300 between the clamp ring 250 and the annular flange 244 of the base ring 240. As the top ring 230 rotates onto the base ring 240, the handles 262, 264 of the top ring 230 and the base ring 240, respectively, move towards one another and clamp down on the elastomer band 300.

FIG. 9 is a cross-sectional view of the top ring 230 fully threaded into the base ring 240 in accordance with an exemplary embodiment. As shown in FIG. 9, once the top ring 230 is fully threaded in a clockwise direction onto the base ring 240, the elastomer band 300 is clamped (or fixed) between the clamp ring 250 and the base ring 240 in a stretched position. In the stretched position, the elastomer band 300 is preferably stretched uniformly in a circular shape. The use of clockwise and counterclockwise as described herein are preferably directions of rotation of the corresponding rings 230, 240. However, instead of clockwise (for clamping the elastomer band between the clamp ring and the base ring 240, 250) and counterclockwise (for de-clamping) as described herein, the rings 230, 240 can rotate in a counterclockwise (e.g., clamping) and clockwise (un-clamping) direction, respectively.

FIG. 10 is a top view of the top ring 230 engaged with a dual latching mechanism 270, which holds the top ring 230 in position, and which in turn secures or holds the elastomer band 300 in place between the clamp ring 250 and the base ring 240. As shown in FIG. 10, the handles 262, 264 move towards one another, and the lever 272 of the dual latch mechanism 270 engages with the ridges or teeth 276 on the outer surface 234 of the top ring 230, which locks or holds the top ring 230 in position. The lever 272 preferably has a pair of offset latches 273, which provides the dual latch mechanism 270 with the ability to adjust the tension of the top ring 230 on the base ring 240 by less than a full notch of a corresponding ridge or teeth 276. The dual latch mechanism 270 is preferably a spring-loaded mechanism or system 274 having one or more springs. Once the top ring 230 is locked into place on the base ring 240, the elastomer band 300 is securely locked (i.e., clamped) in place between the clamp ring 250 and the base ring 240.

FIG. 11 is a cross-sectional view of the elastomer band 300 loaded within the installation fixture 200 and removal of the elastomer band loader 210 from within the installation unit 210. As shown in FIG. 11, once the top ring 230 has been locked in place and the elastomer band 300 has been secured in place, the elastomer band loader 210 is removed from within the top ring 230 the base ring 240, and the clamp ring 250. The removal of the elastomer band loader 210 leaves the elastomer band 300 clamped within the installation unit 220. The elastomer band loader 210 is preferably removed by hand by grasping one or more cross members 214 of the elastomer band loader 210.

Figure 12:
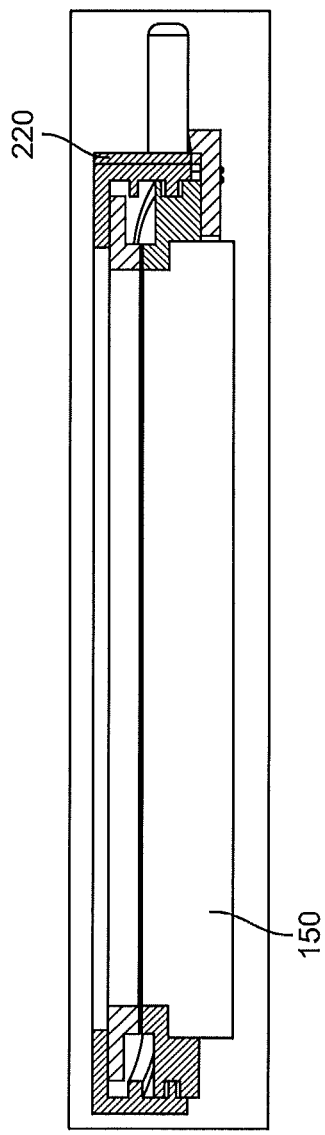
FIG. 12 is a cross-sectional view of the installation unit lowered onto the substrate support in accordance with an exemplary embodiment.

FIG. 12 is a cross-sectional view of the installation unit 220 being lowered onto the substrate support 150 in accordance with an exemplary embodiment. As shown in FIG. 12, the installation unit 220, which is loaded with the elastomer band 300 is lowered onto the substrate support 150 and placed around an outer periphery of the substrate support 150. In accordance with an exemplary embodiment, the installation unit 220 is sized to fit over and around the substrate support 150 in a manner wherein the elastomer band 300 is precisely positioned adjacent to the mounting groove 190.

Figure 13:
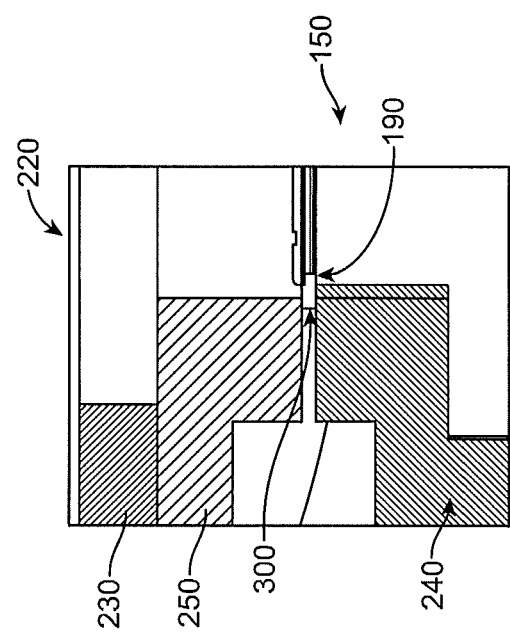
FIG. 13 is a cross-sectional view of the installation unit and elastomer band adjacent to the mounting groove in accordance with an exemplary embodiment.

As shown in FIG. 13, once the installation unit 220 has been lowered around the substrate support 150, the elastomer band 300 is positioned precisely adjacent to the mounting groove 190. Once the elastomer band 300 has been positioned adjacent to the mounting groove 190, the release portion of spring-loaded mechanism 274 of the dual latch mechanism 270 is pushed by the installer, which disengages the lever 272 of the dual latch mechanism 270 from the top ring's teeth 276, which releases and pushes the top ring 230 upward. As the top ring 230 is released, the top ring 230 rotates in a counterclockwise direction, which unthreads the one or more internal threads 238 from the one or more external threads 248. The springs 282 of the one or more compression springs 280 expand upward, which lifts the clamp ring 250 upward, which de-clamps or release the elastomer band 300 from between the clamp ring 250 and the base ring 240. In addition, the extension spring 266 on the top ring 230 expands outward, which rotates the top ring 230 upward (i.e., counterclockwise), which assists with the releasing (or de-clamping) of the elastomer band 300 from between the base ring 240 and the clamp ring 250. Once the elastomer band 300 has been de-clamped or released, the elastomer band 300 contracts inward into the mounting groove 190. Preferably, the elastomer band 300 contracts into the mounting groove 190 in a uniform manner, such that the elastomer band 300 is fully seated within the mounting groove 190.

Once the elastomer band 300 has been released into the groove, the installation unit 220 is removed from the substrate support 150, which provides the installer with access to the elastomer band 300. If the elastomer band 300 is not fully seated within the mounting groove 190, an o-ring pick 500 can be used to move the elastomer band 300 into the mounting groove 190 where the elastomer band 300 did not seat within the mounting groove 190.

FIG. 14 is a perspective view of the substrate support 150 having an elastomer band 300 within the mounting groove 190 and an embedding tool 400. As shown in FIG. 14, if the elastomer band 300 is not fully seated within the mounting groove 190, the installer can use the embedding tool (or push-in-tool) 400 to seat the elastomer band 300 within the groove 190. When the elastomer band 300 has been released into the mounting groove 190, the installer may be required to press the elastomer band 300 further into mounting groove 190. As shown in FIG. 14, the tool 400 preferably includes a curved surface 410 that is curved in a concave manner, and having a radially extending portion 420, which pushes the elastomer band 300 into the mounting groove 190.

FIGS. 15A and 15B are cross-sectional views of the substrate support 150 and the push-in tool or embedding tool 400 in use. As shown in FIGS. 15A and 15B, the embedding tool in placed on an upper surface of the cooling plate 152 and as the embedding tool 400 rests on the upper surface (or shoulder), the embedding tool 400 slides forward, which engages the elastomer band 300 with the radially extending portion 420 of the tool 400, which pushes the elastomer band 300 further into the mounting groove 190, which eliminates any gaps between an outer circumference of the heater plate 142 and the adhesive layers 170, 172 and an inner surface of the elastomer band 300. The process of pushing and fully seating the elastomer band 300 within the mounting groove 190 is repeated around the entire diameter of the substrate support 150.

The methods described above installs the elastomer band 300 around a substrate support 150 while the substrate support is disposed either inside or outside a processing chamber. Due to ease of installation, it is preferable to install the elastomer band 300 around the substrate support 150 while the substrate support 150 is disposed outside of a processing chamber. For example, when outside of a processing chamber, the substrate support 150 may be mechanically fastened to a work-piece, such as a table, for installation of elastomer band 300. When inside of a processing chamber, substrate support 150 may also be mechanically fastened to a work-piece, such as a chamber wall, for installation of elastomer band 300.

Figure 16:
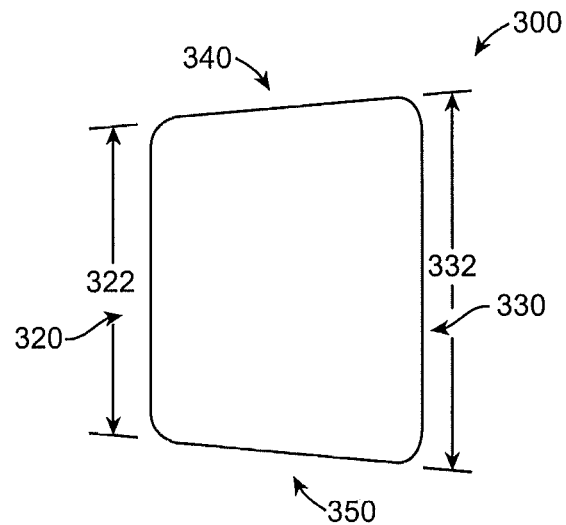
FIG. 16 is a cross-sectional view of an elastomer band having a tapered cross section in accordance with an exemplary embodiment.

FIG. 16 is a cross-sectional view of an elastomer band 300 having a tapered cross section in accordance with an exemplary embodiment. In accordance with an embodiment, the elastomer band 300 has a polygonal cross section, which tapers inwardly. As shown in FIG. 16, the elastomer band 300 has a polygonal cross section, which comprises an inner surface 320, an outer surface 330, an upper surface 340, and a lower surface 350. The upper and lower surfaces 340, 350 taper inwardly from the outer surface 330 towards the inner surface 320. Thus, a height 322 of the inner surface 320 is less than a height 332 of the outer surface 330. In accordance with an embodiment, the height 322 of the inner surface 320 of the elastomer band 300 is less than a height 194 of the mounting groove 190, and the height 332 of the outer surface 330 of the elastomer band is greater than the height 194 of the mounting groove 190. In addition, the transition from the inner and the outer surfaces 320, 330 to the upper and the lower surfaces 340, 350 are preferably rounded or have a curvature thereto.

Figure 17:
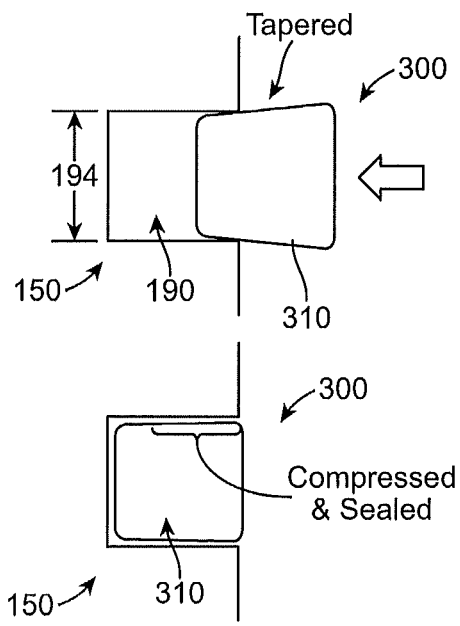
FIG. 17 is a cross-sectional view of the installation of the elastomer band of FIG. 16 into a mounting groove of a substrate support in accordance with an exemplary embodiment.

FIG. 17 is a cross-sectional view of the installation of the elastomer band 300 of FIG. 16 into a mounting groove of a substrate support 150 in accordance with an exemplary embodiment. As shown in FIG. 17, the edge seal 310 in the form of an elastomer band 300 having a polygonal cross section, which tapers inwardly. The elastomer band 300 with a tapered cross section is installed with the inner surface 320 facing inward, wherein the inner surface 320 is shorter in height 322 than the height 194 of the mounting groove 190. As the elastomer band 300 is installed into the mounting groove 190, the outer surface 330 of the elastomer band 300 protrudes from the mounting groove 190 and is preferably pushed into the mounting groove 190 using an embedding tool 400 or other means of pushing the outer surface 330 and corresponding outer portion of the elastomer band 300 into the mounting groove 190. Once the elastomer band 300 has been positioned within the mounting groove, the elastomer band 300 provides a compression seal, which protects the mounting groove 190 from ion and/or plasma attack. In accordance with an embodiment, the elastomer band 300 having a tapered cross section is installed into the mounting groove 190 of a substrate support 150 using an installation fixture 200 as described above.

The methods described above can also be carried out with an elastomer installation kit comprising: an annular installation fixture adapted to mount an elastomer band 300 in a mounting groove around a semiconductor substrate support 150 comprising: an installation unit 220 comprising: a top ring 230, the top ring having one or more internal threads; a clamp ring 240; a base ring 250, the base ring having one or more external threads, which are configured to receive the one or more internal threads of the top ring, and upon tightening of the top ring onto the base ring, the elastomer band is clamped between the clamp ring and the base ring; and a latch and release mechanism 260, which releases the elastomer band into the mounting groove by un-clamping the elastomer band from between the clamp ring and the base ring; and a loading member 210, which positions the elastomer band within the installation unit between the clamp ring and the base ring; and a curved embedding tool 400 adapted to press the elastomer band into the mounting groove in the substrate support, the tool comprising a curved surface that is curved in a concave manner, and has a radially extending portion, which pushes the elastomer band 300 into the mounting groove 190. The kit can also include one or more elastomer bands 300. In accordance with an embodiment, the one or more elastomer bands 300 have a polygonal cross section, which tapers inwardly.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An annular installation fixture adapted to mount an elastomer band in a mounting groove around a semiconductor substrate support used for supporting a semiconductor substrate in a plasma processing chamber comprising:
    an installation unit comprising:
        a top ring, the top ring having one or more internal threads;
        a clamp ring;
        a base ring, the base ring having one or more external threads, which are configured to receive the one or more internal threads of the top ring, and upon tightening of the top ring onto the base ring, the elastomer band is clamped between the clamp ring and the base ring; and
        a latch and release mechanism, which releases the elastomer band into the mounting groove by un-clamping the elastomer band from between the clamp ring and the base ring; and
    a loading member, which positions the elastomer band within the installation unit between the clamp ring and the base ring.

2. The annular installation fixture of claim 1, wherein the clamp ring is an annular ring having an upper section and a lower section, which forms a step on a lower surface of the clamp ring, and wherein the elastomer band is clamped between the clamp ring and an upper surface of the base ring.

3. The annular installation fixture of claim 1, wherein the latch and release mechanism includes a first handle attached to an outer edge of the top ring, a second handle attached to an outer edge of the base ring, and a latch mechanism, which secures the top ring to the base ring.

4. The annular installation fixture of claim 3, wherein the latch mechanism includes a spring-loaded latch, which has a lever, which engages a series of teeth on an outer portion of the top ring.

5. The annular installation fixture of claim 1, wherein the top ring includes an annular member, which includes an outer section and an upper section, the upper section extending from an upper edge of the outer section and inward, and wherein the outer section includes the one or more internal threads, which are configured to receive the one or more external threads on the base ring.

6. The annular installation fixture of claim 5, wherein the top ring includes an extension spring, which engages the latch and release mechanism on the base ring to rotate the top ring in an opposite direction upon de-clamping of the clamp ring.

7. The annular installation fixture of claim 6, wherein the base ring is an annular member having the one or external threads on an outer surface of the annular member, which are configured to engage the one or more internal threads of the top ring.

8. The annular installation fixture of claim 7, wherein the base ring includes an upper annular projection at an inner end of an upper surface of the annular member, and one or more compression springs extending upward from the upper surface of the annular member to a height greater than the annular projection.

9. The annular installation fixture of claim 1, wherein the clamp ring is made of polytetrafluoroethylene (PTFE).

10. An elastomer band installation kit comprising:
    an annular installation fixture adapted to mount an elastomer band in a mounting groove around a semiconductor substrate support comprising:
        an installation unit comprising:
            a top ring, the top ring having one or more internal threads;
            a clamp ring;
            a base ring, the base ring having one or more external threads, which are configured to receive the one or more internal threads of the top ring, and upon tightening of the top ring onto the base ring, the elastomer band is clamped between the clamp ring and the base ring; and
            a latch and release mechanism, which releases the elastomer band into the mounting groove by un-clamping the elastomer band from between the clamp ring and the base ring; and
        a loading member, which positions the elastomer band within the installation unit between the clamp ring and the base ring; and
    a curved embedding tool adapted to press the elastomer band into the mounting groove in the substrate support, the tool comprising a curved surface that is curved in a concave manner, and has a radially extending portion, which pushes the elastomer band into the mounting groove.

11. The elastomer band installation kit of claim 10, further comprising one or more elastomer bands having a polygonal cross section which tapers inwardly.

12. The elastomer band installation kit of claim 10, further comprising an o-ring pick.

13. The elastomer band installation kit of claim 10, wherein the clamp ring is an annular ring having an upper section and a lower section, which forms a step on a lower surface of the clamp ring, and wherein the elastomer band is clamped between the step and an upper surface of the base ring.

14. The elastomer band installation kit of claim 13, wherein the latch and release mechanism includes a first handle attached to an outer edge of the top ring, a second handle attached to an outer edge of the base ring, and a latch mechanism, which secures the top ring to the base ring.

* * * * *